(12) United States Patent
Uematsu et al.

(10) Patent No.: US 8,591,750 B2
(45) Date of Patent: Nov. 26, 2013

(54) MULTILAYER WIRING BOARD AND MANUFACTURING METHOD THEREOF

(75) Inventors: Hiroyuki Uematsu, Tokyo (JP); Kenichi Kawabata, Tokyo (JP); Kenji Nagase, Tokyo (JP)

(73) Assignee: TDK Corporation, Tokyo (JP)

( * ) Notice: Subject to any disclaimer, the term of this patent is extended or adjusted under 35 U.S.C. 154(b) by 792 days.

(21) Appl. No.: 12/659,893

(22) Filed: Mar. 24, 2010

(65) Prior Publication Data

US 2010/0243601 A1    Sep. 30, 2010

(30) Foreign Application Priority Data

Mar. 27, 2009    (JP) .................................. 2009-078223

(51) Int. Cl.
*H01B 13/00*    (2006.01)
*H05K 1/11*    (2006.01)
*H05K 1/14*    (2006.01)

(52) U.S. Cl.
USPC .......................................... 216/13; 361/794

(58) Field of Classification Search
USPC .......................................................... 216/13
See application file for complete search history.

(56) References Cited

U.S. PATENT DOCUMENTS

| | | | |
|---|---|---|---|
| 2002/0083586 A1* | 7/2002 | Iijima et al. | 29/847 |
| 2002/0130103 A1* | 9/2002 | Zimmerman et al. | 216/27 |
| 2003/0043556 A1* | 3/2003 | Sugimoto et al. | 361/760 |
| 2008/0292852 A1* | 11/2008 | En et al. | 428/209 |

FOREIGN PATENT DOCUMENTS

JP    A-2005-136282    5/2005

* cited by examiner

*Primary Examiner* — Binh X Tran
*Assistant Examiner* — Thomas Pham
(74) *Attorney, Agent, or Firm* — Oliff & Berridge, PLC (57) ABSTRACT

Provided is a method for manufacturing a multilayer wiring board, whereby even if the multilayer wiring board suffers warping or irregularities, thin-film patterns with great uniformity that are to be used as a mask for forming a wiring layer can be obtained in a simple way. A primer-coated metal foil 20 composed of a primer resin layer 21 and a metal layer 22 is placed on a surface of a double-face CCL 10, which is prepared by applying metal layers 12 and 13 onto the surfaces of a support base 11, and the primer-coated metal foil 20 and the double-face CCL 10 are bonded and the primer resin layer 21 is cured. A via Vb is thereafter formed from the metal layer 22 side, and a metal-plate layer 30 is formed on the resulting metal layer 22. After that, the etched down metal-plate layer 30 and the metal layer 22 are patterned, and using the patterned layers as a mask, the primer resin layer 21 is patterned. Using the patterned primer resin layer 21 as a mask, the metal layer 12 of the double-face CCL 10 and the metal-plate layer 30 are patterned to form a wiring pattern.

3 Claims, 9 Drawing Sheets

MULTILAYER WIRING BOARD AND MANUFACTURING METHOD THEREOF

CROSS-REFERENCES TO RELATED APPLICATIONS

The present application relates to and claims priority from Japanese Patent Application No. 2009-078223, filed on Mar. 27, 2009, the entire disclosure of which is incorporated herein by reference.

BACKGROUND

1. Field of the Invention

The present invention relates to a multilayer wiring board and a manufacturing method thereof.

2. Description of Related Art

Regarding multilayer wiring boards (multilayer wiring substrates), conventionally known processes of forming a wiring layer such as a conductor (conductive) circuit pattern on an insulating layer include: an additive process in which a wiring layer is selectively formed only in portions of a wiring pattern; a semi-additive process in which a primary layer that is formed on the entire surface of the multilayer wiring board base is selectively removed or masked in portions other than the portions of a wiring pattern, and a wiring layer is formed on the resulting primary layer in accordance with the remaining or exposed patterned primary layer; and a subtractive process in which a conductor (conductive) layer is formed on the entire surface of the base, a resist (photosensitive resin) layer is formed on the conductor layer and patterned by exposing, curing and thereafter developing it to remove unnecessary portions, and using the patterns of the remaining resist layer as a mask, the exposed portions of the conductor layer are removed by etching, etc., so that the portions other than the portions of a wiring pattern are removed selectively from the conductor layer, resulting in the formation of a wiring layer (see, for example, Patent document 1 below).

Patent document 1: Japanese Unexamined Patent Publication No. 2005-136282

SUMMARY

In the subtractive process of the above processes, the pitch of the lines of the resulting conductor circuit pattern depends, in general, on the thickness of the resist layer that serves as a mask layer. This is because an etchant can smoothly circulate, flow or be distributed well between the lines of the resist layer pattern (the etchant can be well drained from the resist layer) if the resist layer is thin, and accordingly, the conductor layer exposed on the bottom of the grooves (recesses) of the resist layer pattern is easily etched; whereas, an etchant cannot smoothly circulate, flow or be distributed well between the lines of the resist layer pattern (the etchant cannot be well drained from the resist layer) if the resist layer is thick, and accordingly, the conductor layer exposed on the bottom of the grooves of the resist layer pattern is not etched easily. The above tendency can be particularly well observed when an etchant exhibiting a high etching factor (the degree of etching in a depth-direction divided by the degree of etching in a lateral direction (side etch, under cut)) is used. Note that the conductor layer may be etched by wet blasting instead of chemical etching, and the same tendency can also be observed in the case of wet blasting, such wet blasting depending on how well a blasting slurry is distributed.

In response to the demand these days for electronic appliances, etc., with further reductions in size and thickness and with higher-density packaging, in order to achieve a wiring pattern with a further reduced pitch, processes of applying a liquid resist as a resist layer in various ways are known, the processes enabling the resist layer to have a further reduction in thickness, specifically, several micrometers in average. Processes of using a dry film resist which is thinner than a liquid resist are also known.

However, multilayer wiring boards are becoming extremely thin, and the board itself is very likely to suffer warping (bending) or irregularities (unevenness, a concavo-convex condition). The degree of warping or the dimensional difference (difference in height) of irregularities often exceeds the thickness of a common liquid resist. Consequently, forming a thin resist layer of a uniform thickness using a liquid resist is likely to become difficult. Also, according to the present inventors' finding, when using a dry film resist as well, forming a thin resist layer of a uniform thickness is likely to become difficult due to the warping or irregularities of the multilayer wiring board base. In addition, as the film is becoming thinner and thinner, it is becoming more difficult and complicated to handle.

Considering the above, an object of the invention is to provide a method for manufacturing a multilayer wiring board, and a multilayer wiring board formed according to the method, whereby even if the multilayer wiring board suffers warping or irregularities, thin-film patterns with great uniformity that are to be used as a mask for forming a wiring layer can be obtained in a simple way.

In order to solve the above-described problems, the invention provides a method for manufacturing a multilayer wiring board, comprising the steps of: forming a first conductor layer on at least one surface of an insulating layer; placing a laminated sheet composed of a resin layer and a second conductor layer on the first conductor layer so that the resin layer comes into contact with the first conductor layer, and curing the resin layer; patterning the second conductor layer; etching the resin layer using the patterned second conductor layer as a mask; and etching the first conductor layer using at least the etched resin layer as a mask and forming a wiring pattern.

In the above method, the insulating layer may have a connection (electrically connecting) hole penetrating (formed through) the insulating layer, and the first conductor layer may be formed inside the connection hole as well in the step of forming the first conductor layer. Also, the above method may be configured such that a conductor layer is formed in advance on at least one surface of the insulating layer, a connection hole is thereafter formed through the insulating layer, and another conductor layer is formed inside the connection hole and on the pre-formed conductor layer, and in this configuration, both the pre-formed conductor layer and the additional conductor layer can be a "first conductor layer."

The invention also provides a method for manufacturing a multilayer wiring board, comprising the steps of: forming a first conductor layer on one surface (a first surface) and the other surface (a second surface) of an insulating layer; placing a laminated sheet composed of a resin layer and a second conductor layer on the first conductor layer that is formed on the one surface of the insulating layer so that the resin layer comes into contact with that first conductor layer, and curing the resin layer; forming a connection hole penetrating (through) the laminated sheet, the first conductor layer formed on the one surface of the insulating layer, and the insulating layer, so that the first conductor layer formed on the other surface of the insulating layer is exposed inside the connection hole; forming a third conductor layer on the second conductor layer and inside the connection hole; patterning the second conductor layer and the third conductor layer;

etching the resin layer using the patterned second and third conductor layers as a mask; and etching the first conductor layer formed on the one surface of the insulating layer using at least the etched resin layer as a mask, and forming a wiring pattern.

In each of the multilayer wiring board manufacturing methods configured as described above, the laminated sheet composed of the resin layer and the second conductor layer is placed so that the resin layer comes into contact with the first conductor layer formed on the insulating layer. Accordingly, the resin layer is patterned first using the patterns formed on the second conductor layer as a mask, and the first conductor layer is thereafter removed by etching using the patterned resin layer as a mask, resulting in the formation of a wiring layer. Thus, by regulating the resin layer, which is used as a mask for etching the wiring layer, to have a small thickness, it is possible to ensure that the spaces between the lines of the wiring layer are reduced to achieve a narrow-pitch (fine-pitch) wiring layer. Also, since the laminated sheet composed of the resin layer and the second conductor layer is used, instead of a sheet of a resin layer alone, an advantageous effect can be brought about because such a laminated sheet exhibits excellent handleability and is easy to bond onto the insulating layer having the first conductor layer formed thereon. Moreover, since the laminated sheet composed of the thin resin layer and the second conductor layer is bonded onto the first conductor layer formed on the insulating layer, a resin layer having a uniform thickness can be easily built up in accordance with the form of the insulating layer (base) even if the insulating layer suffers warping or irregularities.

In order to achieve the reduced pitch of the wiring layer more easily, it is preferable that the resin layer of the laminated sheet is thinner than the first conductor layer.

There are no particular limitations on the size of the insulating layer. Specifically, the insulating layer thickness may be, for example, about 0.1-5 μm. If the thickness of the insulating layer is less than 0.1 μm, the mechanical strength of the insulating layer greatly decreases, which could cause unfavorable destruction or cracking during laser processing or physical processing. If the thickness of the insulating layer exceeds about 5 μm, it is too thick as a mask for forming a wiring layer and achieving a wiring layer with a sufficiently fine pitch is likely to become difficult.

There are no particular limitations on the size of the second conductor layer, which constitutes the laminated sheet together with the insulating layer, either. Specifically, the second conductor layer thickness may be, for example, about 0.1-12 μm. If the thickness of the second conductor layer is less than 0.1 μm, the mechanical strength of the second conductor layer greatly decreases and the handleability of the laminated sheet deteriorates, and the insulating layer could be exposed due to the separation, etc., of the second conductor layer. If the thickness of the second conductor layer exceeds about 12 μm, generating from the insulating layer a necessary mask for forming a wiring layer so that the mask can achieve a fine wiring pattern is likely to become difficult. Note that if the thickness of the second conductor layer is about 12 μm or less, a common mask (resist mask) which is not extremely thin may be used as a mask for patterning the second conductor layer.

The invention provides a multilayer wiring board which is effectively produced (manufactured, obtained) by the multilayer wiring board manufacturing method of the invention, namely, a multilayer wiring board produced (manufactured, obtained) by: forming a first conductor layer on at least one surface of an insulating layer; placing a laminated sheet composed of a resin layer and a second conductor layer on the first conductor layer so that the resin layer comes into contact with the first conductor layer, and curing the resin layer; patterning the second conductor layer; etching the resin layer using the patterned second conductor layer as a mask; and etching the first conductor layer using at least the etched resin layer as a mask and forming a wiring pattern.

The invention also provides a multilayer wiring board obtained by: forming a first conductor layer on one surface (a first surface) and the other surface (a second surface) of an insulating layer; placing a laminated sheet composed of a resin layer and a second conductor layer on the first conductor layer that is formed on the one surface of the insulating layer so that the resin layer comes into contact with that first conductor layer, and curing the resin layer; forming a connection hole penetrating (through) the laminated sheet, the first conductor layer formed on the one surface of the insulating layer, and the insulating layer, so that the first conductor layer formed on the other surface of the insulating layer is exposed inside the connection hole; forming a third conductor layer on the second conductor layer and inside the connection hole; patterning the second conductor layer and the third conductor layer; etching the resin layer using the patterned second and third conductor layers as a mask; and etching the conductor layer formed on the one surface of the insulating layer using at least the etched resin layer as a mask, and forming a wiring pattern.

DETAILED DESCRIPTION OF PREFERRED EMBODIMENTS

Embodiments of the invention will be described below with reference to the attached drawings. In the drawings, the same components are given the same reference numerals, and any repetitive description will be omitted. The positional relationship, such as top and bottom, left and right, etc., is as shown in the drawings unless otherwise specified. The dimensional ratios are not limited to those shown in the drawings. The below embodiments are just examples for describing the invention, and the invention is not limited to those embodiments. The invention can be modified in various ways without departing from the gist of the invention.

FIGS. 1-16 are process flow charts (process charts) illustrating a process in which a multilayer wiring board is formed according to an embodiment of the multilayer wiring board manufacturing method of the invention.

Figure 1:
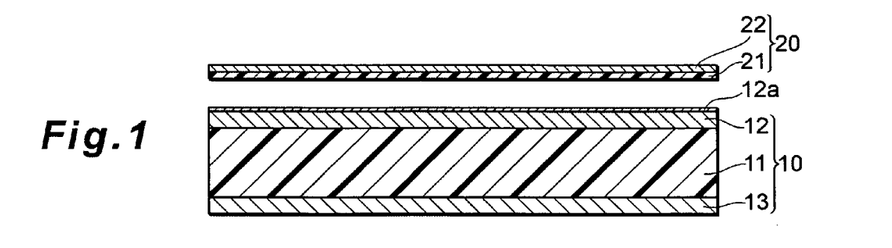
FIG. 1 is a view illustrating a process in which a multilayer wiring board is formed by (with) an embodiment according to the present invention.

In this embodiment, a double-face CCL (copper clad laminate) 10 is prepared first (FIG. 1: step of forming a first conductor layer). The double-face CCL 10 is obtained by forming metal layers 12 and 13 (first conductor layer) which are layers of, for example, foil-like or film-like metal, on both surfaces of a support base 11 (insulating layer). The metal layers 12 and 13 may be metals of any kind, including, for example, gold (Au), silver (Ag), copper (Cu), nickel (Ni), tin (Sn), chrome (Cr), aluminum (Al), tungsten (W), etc., and of these, copper (Cu) is preferred in terms of conductivity and costs (this also applies to other conductor layers, metal films and wiring layers described hereinafter). Also, the thickness of the metal layers 12 and 13 is not specifically limited, and metal layers having a thickness of around 7 µm may be used.

The support base 11 may be, for example, an insulating resin layer, and specific examples of the resin material used for such an insulating resin layer include, for example, vinyl benzyl resin, polyvinyl benzyl ether compound resin, bismaleimide-triazine resin (BT resin), polyphenylene ether (polyphenylene ether oxide) resin (PPE, PPO), cyanate ester resin, epoxy+active ester cured resin, polyphenylene ether resin (polyphenylene oxide resin), curable polyolefin resin, benzocyclobutene resin, polyimide resin, aromatic polyester resin, aromatic liquid crystal polyester resin, polyphenylene sulfide resin, polyetherimide resin, polyacrylate resin, polyether ether ketone resin, fluorine resin, epoxy resin, phenol resin, and benzoxazine resin, each being used alone. Examples also include: materials obtained by adding, to the above-indicated resins, silica, talc, calcium carbonate, magnesium carbonate, aluminum hydroxide, magnesium hydroxide, aluminum borate whisker, potassium titanate fiber, alumina, glass flakes, glass fiber, tantalum nitride, aluminum nitride, or the like; materials obtained by adding, to the above resins, metal oxide powder containing at least one metal from among magnesium, silicon, titanium, zinc, calcium, strontium, zirconium, tin, neodymium, samarium, aluminum, bismuth, lead, lanthanum, lithium and tantalum; materials obtained by mixing the above resins with glass fiber, resin fiber such as aramid fiber, or the like; and materials obtained by impregnating glass (fiber) cloth, aramid fiber, nonwoven fabric, or the like with the above resins. The above materials may arbitrarily be selected in view of electric properties, mechanical properties, water absorbing properties, reflow resistance (e.g., in/for soldering process), etc.

Next, the surface of the metal layer 12, which is formed on one surface (a first surface) of the double-face CCL 10, is roughened to form a roughened layer 12a. During the roughening, 10-200 nm micropores may be formed on the surface of the metal layer 12 to obtain a reduced roughness. Also, considering the following formation of a resin layer, it is preferable that a silane compound (not shown in the drawing) is adhered (adsorbed) on the roughened layer 12a that has been given a reduced roughness. As a wiring pattern becomes increasingly fine, transmission loss becomes more likely to occur; however, such transmission loss can effectively be reduced if the roughened layer 12a is treated to have a reduced roughness.

Figure 2:
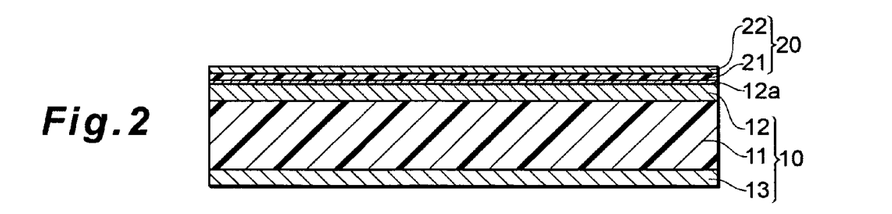
FIG. 2 is a view illustrating a process in which a multilayer wiring board is formed by (with) an embodiment according to the present invention.

After that, a primer-coated metal foil 20 (laminated sheet) having a single-face CCL (copper clad laminate) structure of a metal layer 22 (second conductor layer) of copper foil, etc., coated with an uncured primer resin layer 21 (resin layer) is placed so that the uncured primer resin layer 21 comes into contact with the roughened layer 12a of the metal layer 12, and the double-face CCL 10 and the primer-coated metal foil 20 are pressed, for example, with heat to bond them and cure the primer resin layer 21 (FIG. 1 and FIG. 2: step of placing a laminated sheet and curing a resin layer). The primer resin layer 21 is a resin layer which is composed of epoxy resin, curing agent, aromatic polyamide resin polymer, etc., and exhibits high elasticity and high toughness. Although a certain level of strength can be obtained by bonding an ordinary epoxy resin onto the roughened layer 12a that is given a reduced roughness, the primer resin layer 21 having high elasticity and high toughness can readily be bonded onto the roughened layer 12a with even more strength. There is no particular limitation on the thickness of the primer resin layer 21, and specifically, as already stated above, the primer resin layer 21 may be a thin layer with a thickness of about 0.1-5 μm. Also, there is no particular limitation on the thickness of the metal layer 22, and specifically, as already stated above, the metal layer 22 may be a thin layer with a thickness of about 0.1-12 μm.

Figure 3:
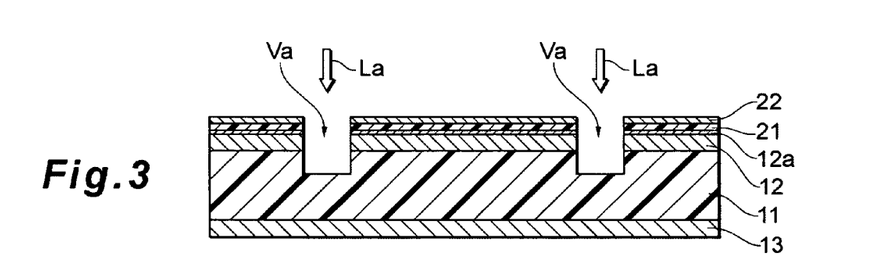
FIG. 3 is a view illustrating a process in which a multilayer wiring board is formed by (with) an embodiment according to the present invention.
Figure 4:
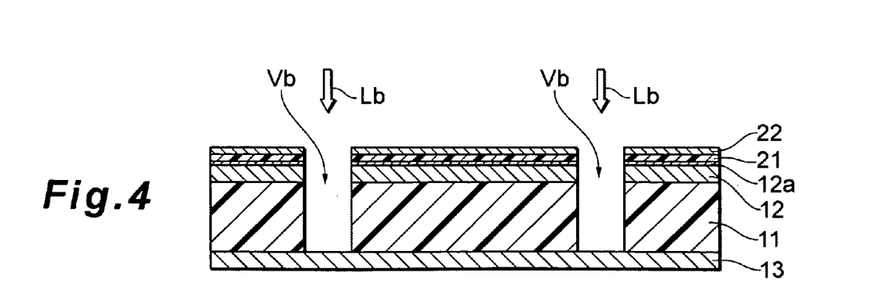
FIG. 4 is a view illustrating a process in which a multilayer wiring board is formed by (with) an embodiment according to the present invention.

Next, the resulting layered product is irradiated from the metal layer 22 side with, for example, a laser beam La (e.g., UV-YAG laser) of a predetermined diameter, so that a hole Va for the formation of a via is formed to extend through the metal layer 22, the cured primer resin layer 21 and the metal layer 12 to part of the way through the support base 11 (FIG. 3). The portion where the hole Va is formed is thereafter irradiated with a laser beam Lb (e.g., carbon dioxide ($CO_2$) laser) of almost the same diameter, to form a via Vb (connection hole) through the support base 11 so that part of the metal layer 13, which is formed on the other surface (second surface) of the support base 11, is exposed inside the via Vb (FIG. 4: step of forming a connection hole and exposing the first conductor layer inside the connection hole). In the above, the via Vb may be formed in a single step using a carbon dioxide ($CO_2$) laser, instead of being formed in two steps using different laser beams.

Figure 5:
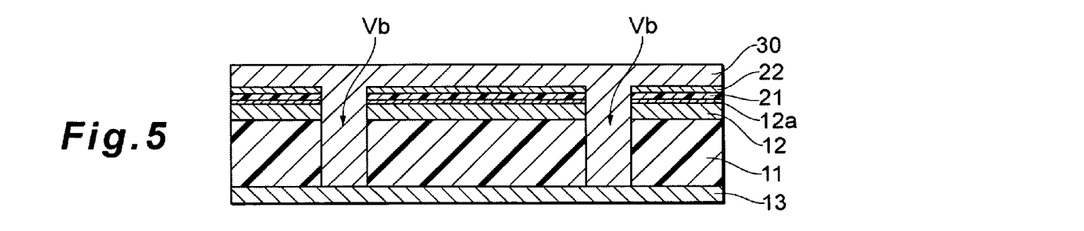
FIG. 5 is a view illustrating a process in which a multilayer wiring board is formed by (with) an embodiment according to the present invention.
Figure 6:
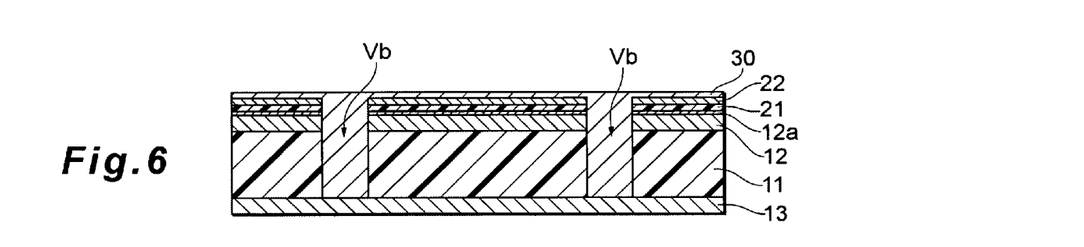
FIG. 6 is a view illustrating a process in which a multilayer wiring board is formed by (with) an embodiment according to the present invention.
Figure 7:
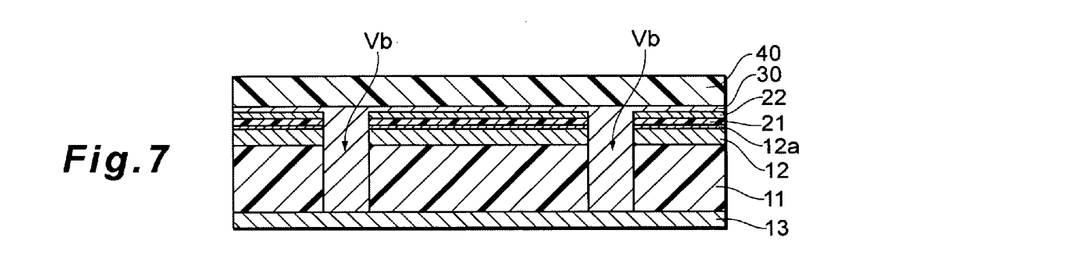
FIG. 7 is a view illustrating a process in which a multilayer wiring board is formed by (with) an embodiment according to the present invention.
Figure 8:
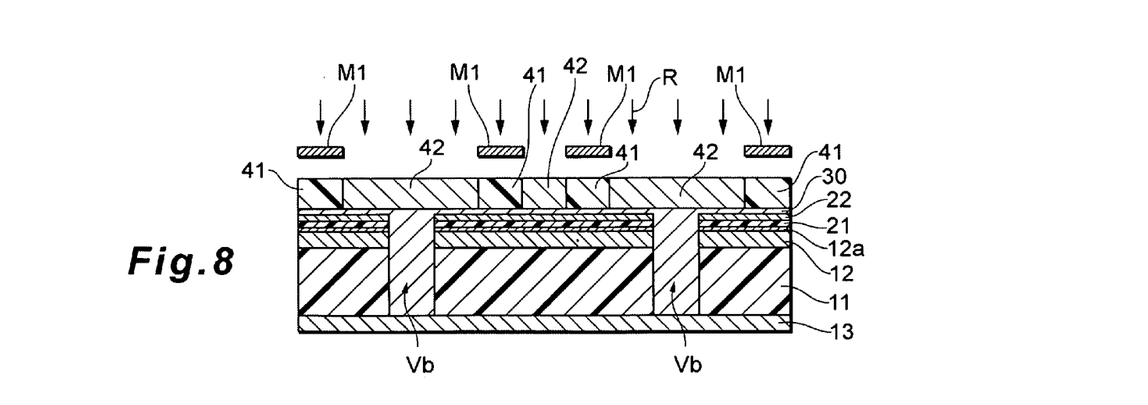
FIG. 8 is a view illustrating a process in which a multilayer wiring board is formed by (with) an embodiment according to the present invention.

After that, a metal plate, e.g., a copper plate is applied to the resulting layered product in which the via Vb has been formed, more specifically, on the metal layer 22 and the inside of the via Vb, thereby forming a metal-plate layer 30 with which the metal layer 22 and the via Vb are covered or filled (FIG. 5: step of forming a third conductor layer on the second conductor layer and inside the connection hole). The obtained metal-plate layer 30 is etched down so that it has a predetermined thickness above the metal layer 22 (the thickness is not particularly limited, for example, several micrometers) (FIG. 6). Subsequently, a dry film resist 40, for example, a UV-sensitive dry film resist, is applied and bonded onto the metal-plate layer 30 (FIG. 7), and a predetermined mask M1, for example, a metal mask (reticle), is placed above the dry film resist 40, and curing rays R such as ultraviolet rays are applied onto the dry film resist 40 through the mask M1 to expose the dry film resist 40 (FIG. 8). In FIG. 8, portions 41 in the dry film resist 40 that have not been exposed and remain uncured are distinguished from portions 42 that have been exposed and cured.

Figure 9:
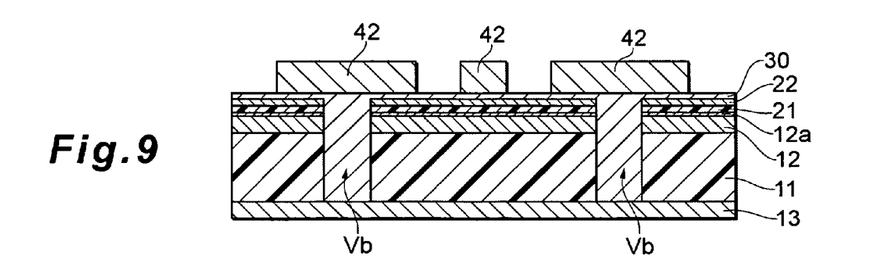
FIG. 9 is a view illustrating a process in which a multilayer wiring board is formed by (with) an embodiment according to the present invention.
Figure 10:
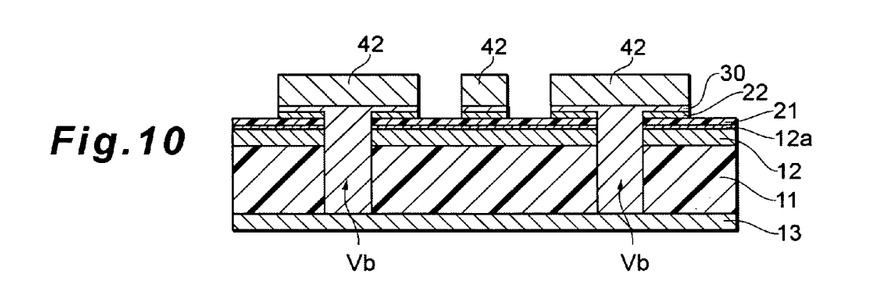
FIG. 10 is a view illustrating a process in which a multilayer wiring board is formed by (with) an embodiment according to the present invention.

The mask M1 is subsequently removed, and the exposed dry film resist 40 is developed to remove the uncured portions 41 in the dry film resist 40 from the metal-plate layer 30 (FIG. 9). Next, using the portions 42 that have been cured by the exposure and remain in the dry film resist 40 as a mask, the metal-plate layer 30 that has been exposed between the portions 42, and the corresponding portions of the lower metal layer 22 are etched (micro-etched) by wet etching, etc., to make patterns (FIG. 10: step of patterning the second conductor layer and the third conductor layer). As a result, the metal layer 22, originally formed as a component of the primer-coated metal foil 20, is patterned, and parts of the primer resin layer 21 are exposed.

Figure 11:
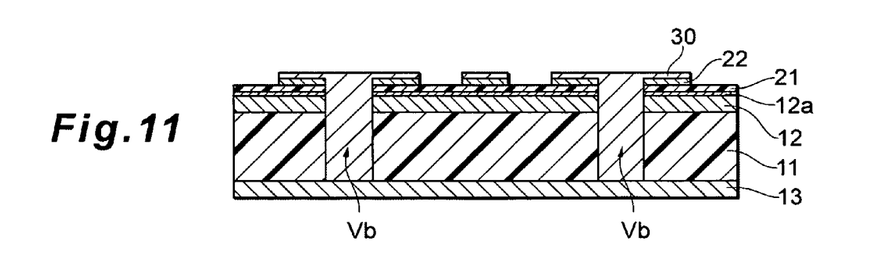
FIG. 11 is a view illustrating a process in which a multilayer wiring board is formed by (with) an embodiment according to the present invention.

After that, the remaining portions 42 of the dry film resist 40 that have been used as a mask are separated and removed (FIG. 11). Using the patterned metal-plate layer 30 and metal layer 22 as a mask, the primer resin layer 21 exposed between the obtained patterns is irradiated with a medium Lc, such as a laser beam, wet blasting medium, and desmearing medium, to etch and remove the irradiated portions of the primer resin layer 21 (FIG. 12: step of etching the resin layer using the patterned second and third conductor layers as a mask).

Figure 12:
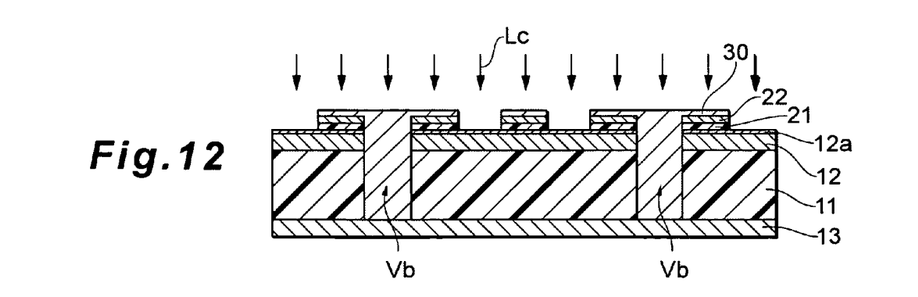
FIG. 12 is a view illustrating a process in which a multilayer wiring board is formed by (with) an embodiment according to the present invention.
Figure 13:
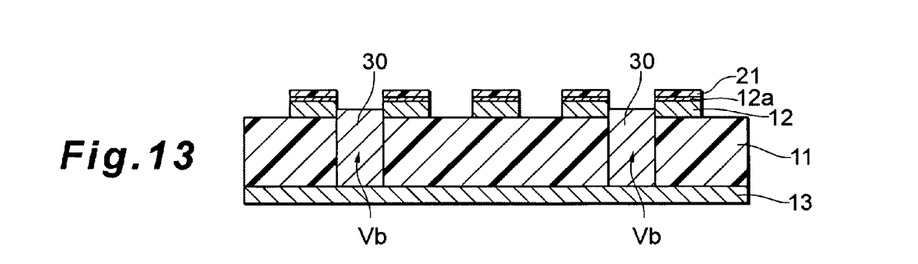
FIG. 13 is a view illustrating a process in which a multilayer wiring board is formed by (with) an embodiment according to the present invention.

Next, the resulting layered product shown in FIG. 12 is etched, for example, by wet etching. By this etching, the metal-plate layer 30 above the primer resin layer 21, and the metal layer 12 with the roughened layer 12a that has been exposed due to the removal of the primer resin layer 21 built up thereon are removed, and the metal layer 22 that remains on the primer resin layer 21 is also removed thereafter. By continuing etching, the patterned primer resin layer 21 begins to function as a mask, and thereby the metal layer 12 between the patterns is removed and the top of the metal-plate layer 30 formed inside the via Vb is partially removed as well. As a result, a wiring pattern constituted by the patterned metal layer 12 and the metal-plate layer 30 inside the via Vb is formed (FIG. 13: step of etching the first conductor layer formed on the one surface of the insulating layer using the etched resin layer as a mask, and forming a wiring pattern).

In the above etching, since the patterns on the primer resin layer 21, which is a thin layer as described above, are used as a mask for etching the metal layer 12, even if the support base 11, etc., suffers warping or irregularities, thin-film patterns with great uniformity that are to be used as a mask for forming a wiring layer can be obtained in a simple way. Accordingly, even if the patterns have narrow spaces between them, the metal layer 12 can be etched suitably, and the size and pitch of the resulting wiring pattern can be reduced. In addition, when side-etching proceeds in the metal layer 12 between the patterns of the primer resin layer 21, since both ends of the primer resin layer 21 bend downward at an early stage of the side-etching, the side-etching can be prevented from proceeding further.

Figure 14:
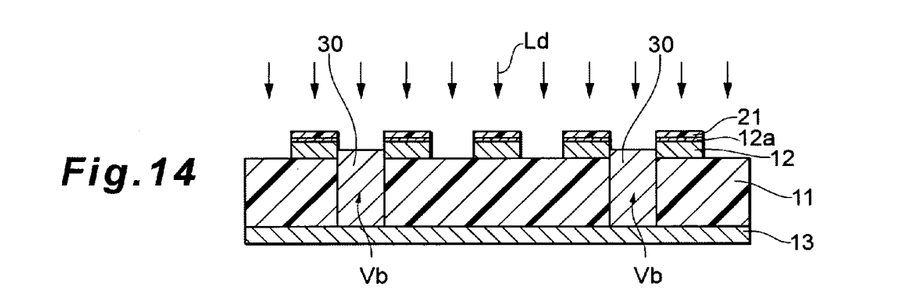
FIG. 14 is a view illustrating a process in which a multilayer wiring board is formed by (with) an embodiment according to the present invention.
Figure 15:
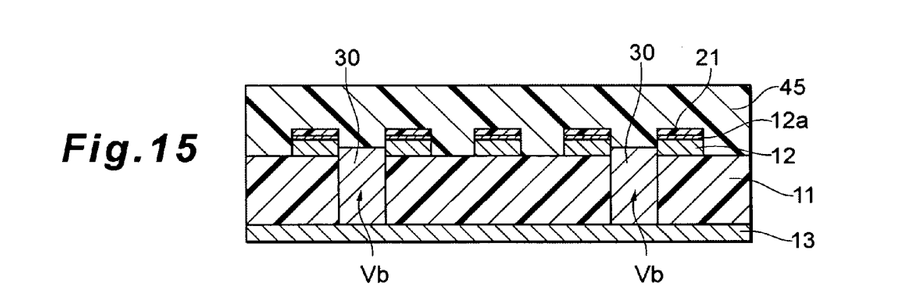
FIG. 15 is a view illustrating a process in which a multilayer wiring board is formed by (with) an embodiment according to the present invention.
Figure 16:
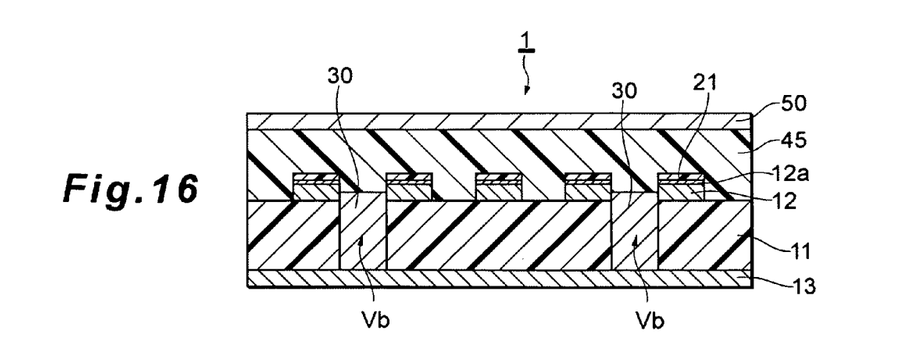
FIG. 16 is a view illustrating a process in which a multilayer wiring board is formed by (with) an embodiment according to the present invention.

After that, the remaining primer resin layer 21 may be irradiated, if necessary, with plasma Ld, etc., to roughen the surface thereof (FIG. 14). In the irradiation, the primer resin layer 21 may be removed (FIG. 14 shows the state where the primer resin layer 21 is left). A resin layer 45 is thereafter built up (layered) on the resulting layered product, and the surface of the resin layer 45 is planarized (FIG. 15), and furthermore, an upper metal layer 50 of a predetermined thickness (for example, almost the same thickness as the metal layers 12 and 13) is built up on the resin layer 45. The resulting layered product is pressed, and as a result, a multilayer wiring board 1 according to this embodiment is obtained.

If the surface of the remaining primer resin layer 21 is roughened, the adhesion between the primer resin layer 21 and the resin layer 45 built up thereon can be greatly enhanced. Note that the resin layer 45 may be a built-up layer and may also be a solder resist formed on the top surface of the multilayer wiring board 1.

It is preferable that the surface roughness of the interface between the primer resin layer 21 and the resin layer 45 is larger (more) than the surface roughness of the interface between the metal layer 12 and the primer resin layer 21 (namely, the roughness of the roughened layer 12a). More specifically, the primer resin layer 21 can be built up with sufficient adhesion on the surface (roughened layer 12a) of the metal layer 12 having a reduced surface roughness; however, in order to enhance the adhesion between the primer resin layer 21 and the resin layer 45 built up thereon, it is preferable that the boundary between them has an increased roughness. This roughness refers to the form of roughness on the bonding surface between the metal layer 22 and the primer resin layer 21, and the degree and form of the surface roughness may arbitrarily be selected so long as the roughness is smaller than the thickness of primer resin layer 21. The surface roughness Rz can be measured by a laser displacement meter, etc., and the form of roughness can be found by observing a cross-section.

FIGS. 17-36 are process flow charts (process charts) illustrating a process in which a multilayer wiring board is formed according to another embodiment of the multilayer wiring board manufacturing method of the invention.

Figure 17:
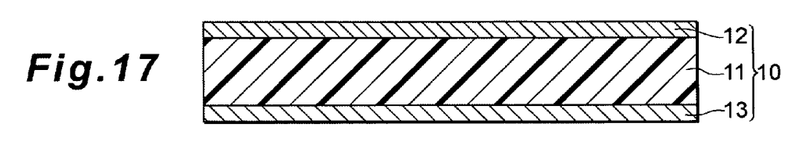
FIG. 17 is a view illustrating a process in which a multilayer wiring board is formed by (with) another embodiment according to the present invention.
Figure 18:
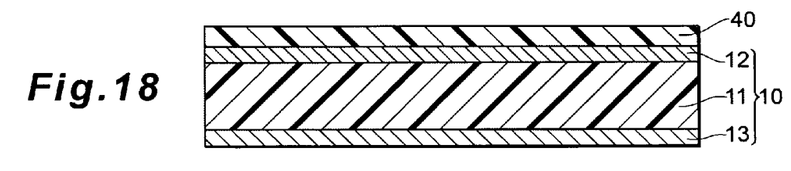
FIG. 18 is a view illustrating a process in which a multilayer wiring board is formed by (with) another embodiment according to the present invention.
Figure 19:
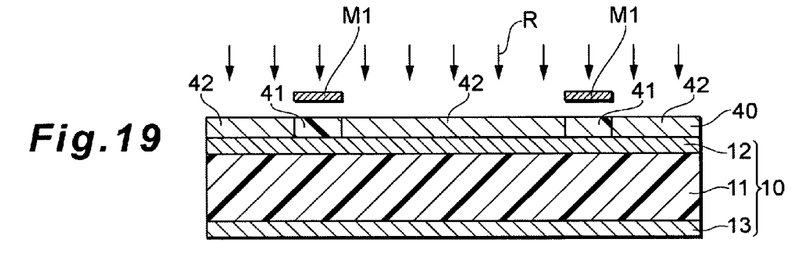
FIG. 19 is a view illustrating a process in which a multilayer wiring board is formed by (with) another embodiment according to the present invention.
Figure 20:
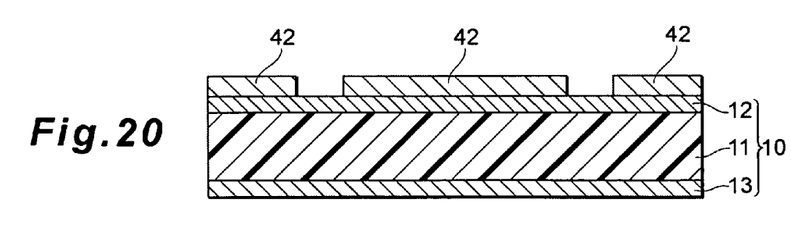
FIG. 20 is a view illustrating a process in which a multilayer wiring board is formed by (with) another embodiment according to the present invention.

In this embodiment as well, a double-face CCL 10 is prepared first by forming metal layers 12 and 13 on both surfaces of a support base 11 (FIG. 17). Next, a dry film resist 40 is built up and bonded onto one surface (first surface) of the double-face CCL 10 (FIG. 18). After that, in the same manner as explained above in reference to FIG. 8, a predetermined mask M1, for example, a metal mask (reticle) is placed above the dry film resist 40, and curing rays R such as ultraviolet rays are applied onto the dry film resist 40 through the mask M1 to expose the dry film resist 40, thereby obtaining portions 41 that have not been exposed and remain uncured and portions 42 that have been exposed and cured (FIG. 19). The mask M1 is subsequently removed, and the exposed dry film resist 40 is developed to remove the uncured portions 41 in the dry film resist 40 from the metal layer 12 (FIG. 20).

Figure 21:
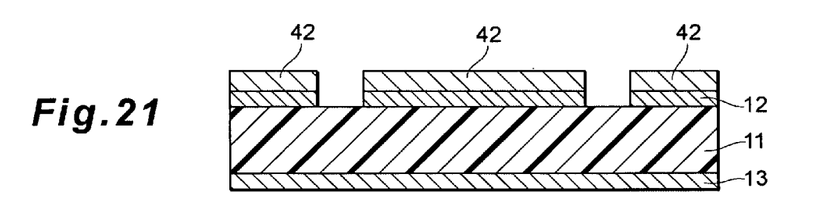
FIG. 21 is a view illustrating a process in which a multilayer wiring board is formed by (with) another embodiment according to the present invention.
Figure 22:
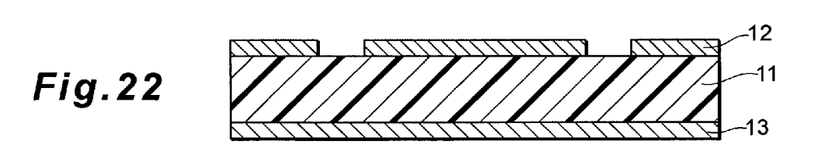
FIG. 22 is a view illustrating a process in which a multilayer wiring board is formed by (with) another embodiment according to the present invention.
Figure 23:
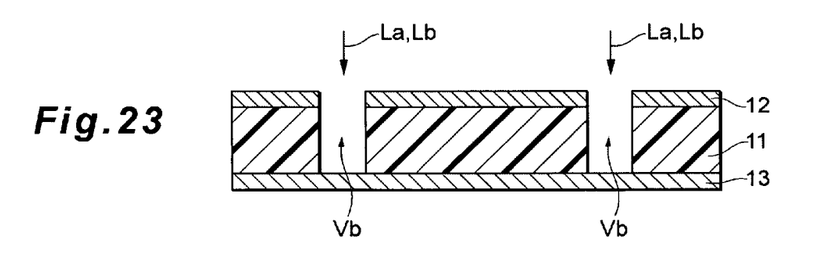
FIG. 23 is a view illustrating a process in which a multilayer wiring board is formed by (with) another embodiment according to the present invention.
Figure 24:
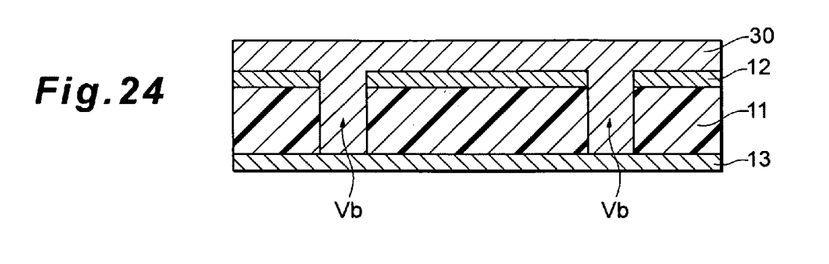
FIG. 24 is a view illustrating a process in which a multilayer wiring board is formed by (with) another embodiment according to the present invention.

Next, using the portions 42 that have been cured by the exposure and remain in the dry film resist 40 as a mask, the metal layer 12 that has been exposed between the portions 42 is etched by wet etching, etc., to make patterns (FIG. 21). The remaining portions 42 in the dry film resist 40 that have been used as a mask are thereafter separated and removed (FIG. 22). After that, in the same manner as explained above in reference to FIGS. 3 and 4, the resulting layered product is irradiated from the metal layer 12 side with, for example, a laser beam La and/or a laser beam Lb, each having a predetermined diameter, so that a via Vb is formed through the support base 11 and part of the metal layer 13, which is formed on the other surface (second surface) of the support base 11, is exposed inside the via Vb (FIG. 23). After that, in the same manner as explained above in reference to FIG. 5, a metal plate, e.g., a copper plate is applied to the resulting layered product in which the via Vb has been formed, more specifically, on the metal layer 12 and inside of the via Vb, thereby forming a metal-plate layer 30 with which the metal layer 12 and the via Vb are covered or filled (FIG. 24).

Figure 25:
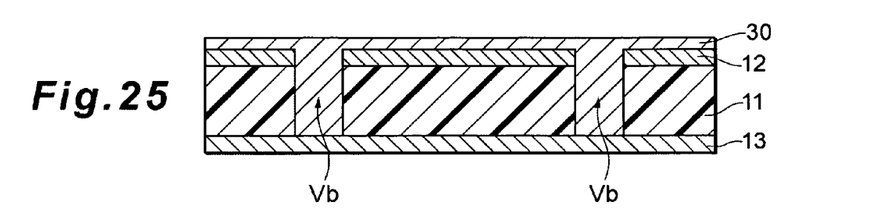
FIG. 25 is a view illustrating a process in which a multilayer wiring board is formed by (with) another embodiment according to the present invention.
Figure 26:
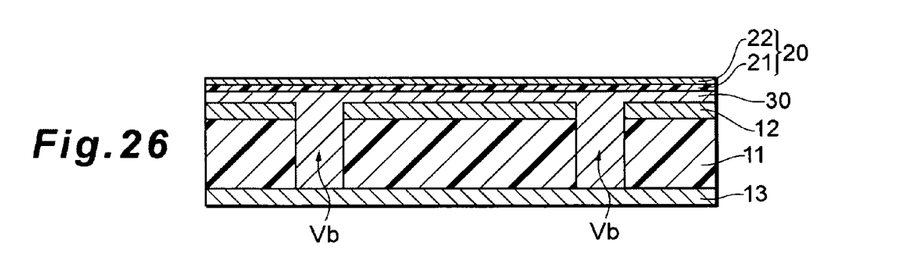
FIG. 26 is a view illustrating a process in which a multilayer wiring board is formed by (with) another embodiment according to the present invention.

Next, in the same manner as explained above in reference to FIG. 6, the obtained metal-plate layer 30 is etched down so that it has a predetermined thickness above the metal layer 12 (the thickness is not particularly limited, for example, several micrometers) (FIG. 25). After that, a primer-coated metal foil 20 formed of a metal layer 22 of copper foil, etc., coated with an uncured primer resin layer 21 is placed so that the uncured primer resin layer 21 comes into contact with the metal-plate layer 30, and the layered product shown in FIG. 25 and the primer-coated metal foil 20 are pressed, for example, with heat to bond them and cure the primer resin layer 21 (FIG. 26: step of placing a laminated sheet and curing a resin layer). Accordingly, in this embodiment, a first conductor layer is constituted by the metal layer 12 and the etched down metal-plate layer 30. In other words, both the step of preparing the double-face CCL 10 shown in FIG. 17 and the step of forming the metal-plate layer 30 on the metal layer 12 and inside the via Vb correspond to the step of forming a first conductor layer on at least one surface of an insulating layer.

Figure 27:
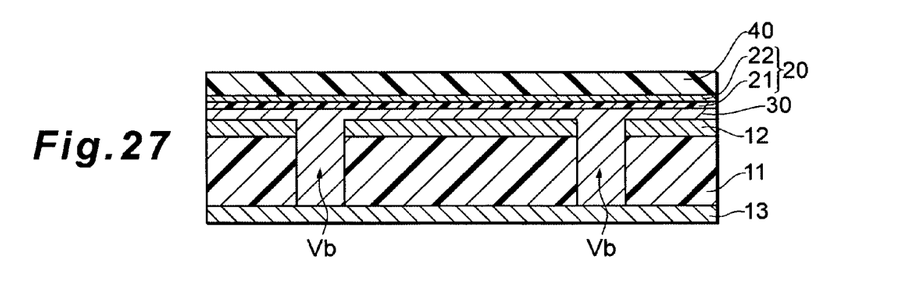
FIG. 27 is a view illustrating a process in which a multilayer wiring board is formed by (with) another embodiment according to the present invention.
Figure 28:
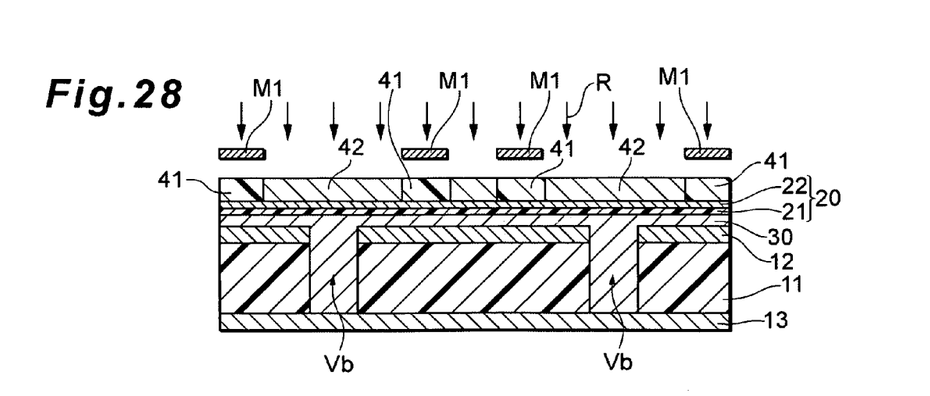
FIG. 28 is a view illustrating a process in which a multilayer wiring board is formed by (with) another embodiment according to the present invention.

Subsequently, a dry film resist 40, e.g., a UV-sensitive resist, is again built up and bonded on the metal layer 22 of the primer-coated metal foil 20 (FIG. 27). A predetermined mask M1, for example, a metal mask (reticle) is thereafter placed above the dry film resist 40, and curing rays R such as ultraviolet rays are applied onto the dry film resist 40 through the mask M1 to expose the dry film resist 40, thereby obtaining portions 41 that have not been exposed and remain uncured and portions 42 that have been cured as a result of exposure (FIG. 28).

Figure 29:
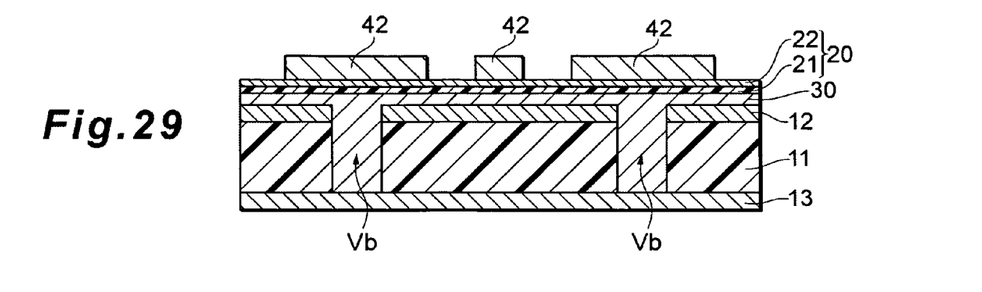
FIG. 29 is a view illustrating a process in which a multilayer wiring board is formed by (with) another embodiment according to the present invention.
Figure 30:
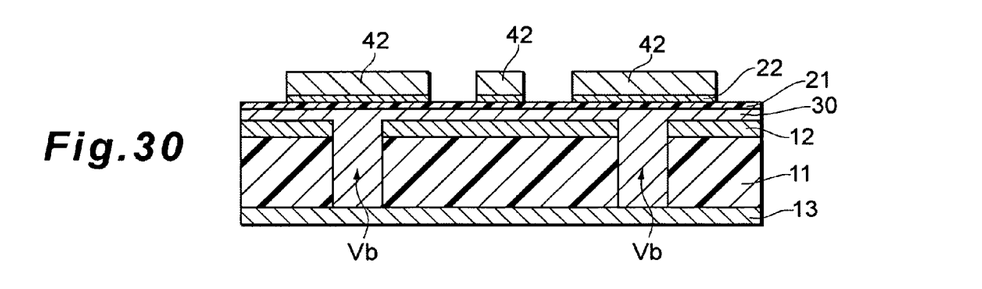
FIG. 30 is a view illustrating a process in which a multilayer wiring board is formed by (with) another embodiment according to the present invention.

The mask M1 is subsequently removed, and the exposed dry film resist 40 is developed to remove the uncured portions 41 in the dry film resist 40 from the metal layer 22 (FIG. 29). Using the portions 42 that have been cured by the exposure and remain in the dry film resist 40 as a mask, the metal layer 22 that has been exposed between the portions 42 is etched (micro-etched) by wet etching, etc., to make patterns (FIG. 30: step of patterning the second conductor layer). As a result, the metal layer 22, originally formed as a component of the primer-coated metal foil 20, is patterned, and parts of the primer resin layer 21 are exposed.

Figure 31:
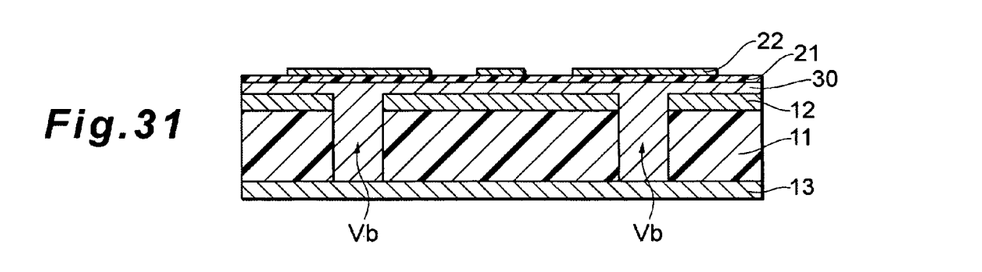
FIG. 31 is a view illustrating a process in which a multilayer wiring board is formed by (with) another embodiment according to the present invention.

Next, the remaining portions 42 of the dry film resist 40 that have been used as a mask are separated and removed (FIG. 31). After that, using the patterned metal layer 22 as a mask, the primer resin layer 21 exposed between the patterns is irradiated with a medium Lc, such as a laser beam, wet blasting medium, and desmearing medium, to etch and remove the irradiated portions of the primer resin layer 21 (FIG. 32: step of etching the resin layer using the patterned second conductor layer as a mask).

Figure 32:
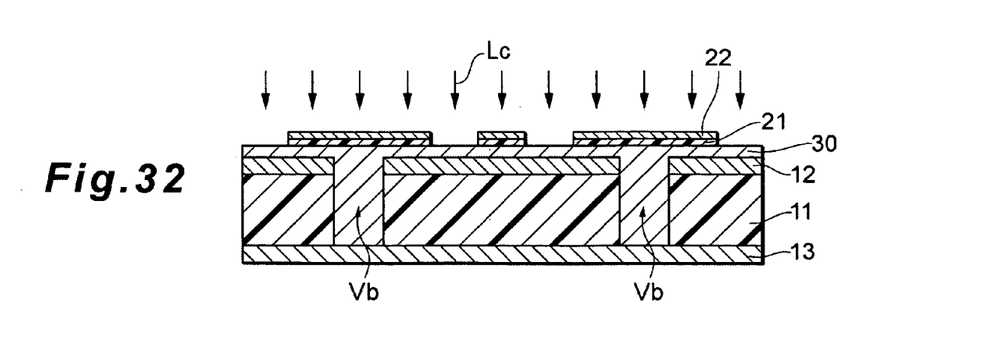
FIG. 32 is a view illustrating a process in which a multilayer wiring board is formed by (with) another embodiment according to the present invention.
Figure 33:
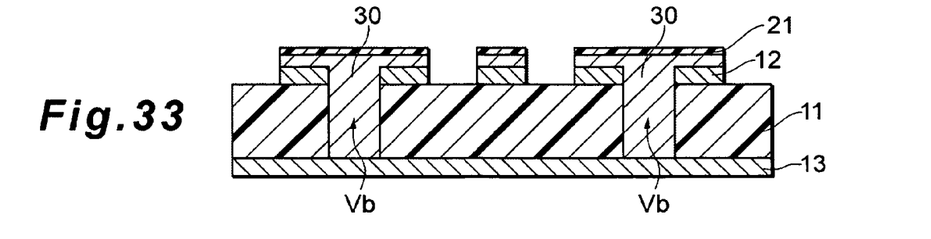
FIG. 33 is a view illustrating a process in which a multilayer wiring board is formed by (with) another embodiment according to the present invention.

The resulting layered product shown in FIG. 32 is etched, for example, by wet etching. By this etching, the metal layer 22 above the primer resin layer 21, and the metal layer 12 that has been exposed due to the removal of the primer resin layer 21, are removed, and the metal layer 22 that remains on the primer resin layer 21 is also removed thereafter. By continuing etching, the patterned primer resin layer 21 begins to function as a mask, and thereby the metal-plate layer 30 and the metal layer 12 between the patterns are removed, resulting in the formation of a wiring pattern constituted by the patterned metal layer 12 and the metal-plate layer 30 that is inside the via Vb and remains on the metal layer 12 (FIG. 33: step of etching the first conductor layer using the etched resin layer as a mask, and forming a wiring pattern).

In this embodiment as well, since the patterns on the primer resin layer 21, which is a thin layer as described above, are used as a mask for etching the metal layer 12 and the metal-plate layer 30, even if the support base 11, etc., suffers warping or irregularities, thin-film patterns with great uniformity that are to be used as a mask for forming a wiring layer can be obtained in a simple way. Accordingly, even if the patterns have narrow spaces between them, the metal layer 12 and the metal-plate layer can be etched suitably, and the size and pitch of the resulting wiring pattern can be reduced. In addition, when side-etching proceeds in the metal layer 12 between the patterns on the primer resin layer 21, both ends of the primer resin layer 21 bend downward at an early stage of the side-etching, preventing the side-etching from proceeding further.

Figure 34:
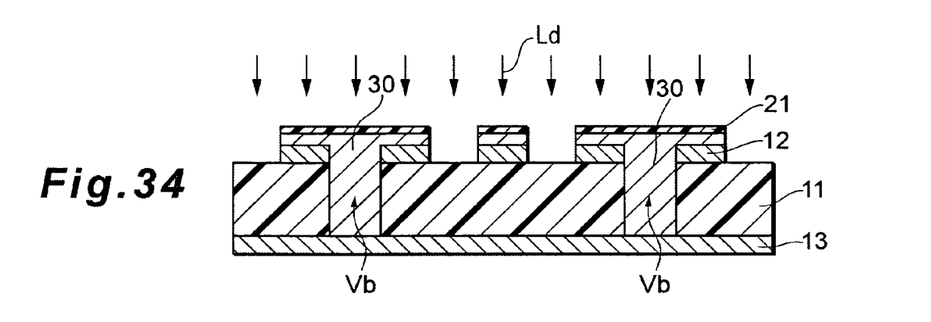
FIG. 34 is a view illustrating a process in which a multilayer wiring board is formed by (with) another embodiment according to the present invention.
Figure 35:
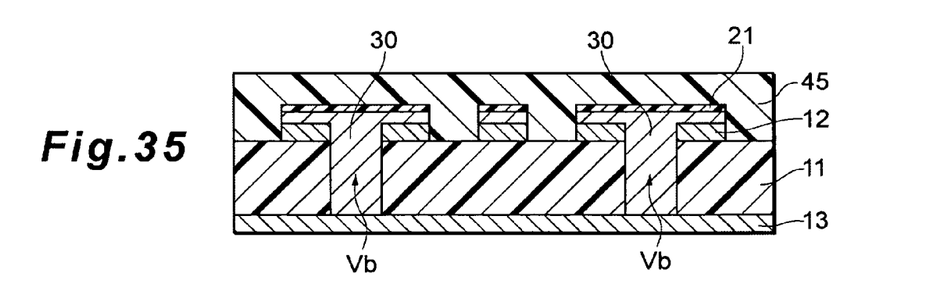
FIG. 35 is a view illustrating a process in which a multilayer wiring board is formed by (with) another embodiment according to the present invention.
Figure 36:
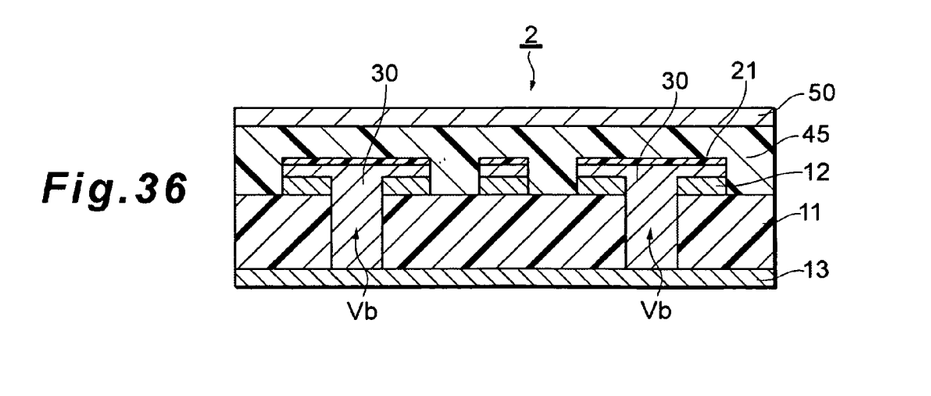
FIG. 36 is a view illustrating a process in which a multilayer wiring board is formed by (with) another embodiment according to the present invention.

After that, the remaining primer resin layer 21 may be irradiated, if necessary, with plasma Ld, etc., to roughen the surface thereof (FIG. 34). In this embodiment as well, the primer resin layer 21 may be removed in the above irradiation (FIG. 34 shows the state where the primer resin layer 21 is left). A resin layer 45 is thereafter built up (layered) on the resulting layered product, and the surface thereof is planarized (FIG. 35), and furthermore, an upper metal layer 50 of a predetermined thickness (for example, almost the same thickness as the metal layers 12 and 13) is built up on the resin layer 45. The resulting layered product is pressed, and as a result, a multilayer wiring board 2 according to this embodiment is obtained. In the multilayer wiring board 2 as well, if the surface of the remaining primer resin layer 21 is roughened, and if the resin layer 45 built up on the primer resin layer 21 is of a particular kind of material, the adhesion between the primer resin layer 21 and the resin layer 45 can be greatly enhanced.

As already stated above, the invention is not limited to the above-described embodiments, and may be modified in various ways without departing from the gist of the invention. For example, the multilayer configuration of the multilayer wiring boards 1 and 2 is not limited to the configuration having the illustrated number of layers. The multilayer wiring boards 1 and 2 may have even more layers, and in that case, a via-on-via configuration in which another insulating layer having a via is formed on the via Vb and the upper metal layer 50 may be employed. Also, the metal layer 12 of the double-face CCL 10 is not necessarily roughened. Moreover, electronic components such as active components and passive components may be mounted inside or outside of the multilayer wiring boards 1 and 2. Examples of such electronic components include: semiconductor devices and other active components; and condensers, inductors, thermistors, resistance and other various passive components (a single chip component such as L, C or R, L-C-R arrays, L-C-R composite chip components using a multilayer substrate, etc.).

Furthermore, instead of the double-face CCL 10, for example, a single-face CCL that is prepared by forming the metal layer 13 on the support base 11 may be used, and the metal layer 12 may be formed on the surface opposite the surface on which the metal layer 13 is formed, by means of a known film-formation method, including plating (non-electrolyte plating+electrolyte plating), CVD such as vapor phase growth, and PVD such as vapor deposition and sputtering. The metal layer 13 may also be formed by a known film-formation method. Moreover, the metal layer 13 may not be formed.

As described above, according to the multilayer wiring board of the invention and the manufacturing method thereof, even if the multilayer wiring board suffers warping or irregularities, thin-film patterns with great uniformity that are to be used as a mask for forming a wiring layer can be obtained in a simple way, and etching using an etchant exhibiting a high etching factor can be well handled. Accordingly, the invention can be widely and effectively utilized in modules, appliances, apparatuses, systems, devices, etc., that have a circuit pattern or electronic component embedded therein, in particular, those that require higher performance.

According to the invention, a laminated sheet composed of an insulating layer and a second conductor layer is bonded onto a first conductor layer, which is a layer from which a wiring layer is to be formed, so that the insulating layer comes into contact with the first conductor layer, and the patterned insulating layer can be used as a mask for forming a wiring layer from the first conductor layer. Accordingly, by regulating the insulating layer to be a sufficiently thin layer, a further finer wiring layer with further reduced pitch can be obtained, which has been difficult to achieve with a conventional liquid resist or dry film resist.

What is claimed is:

1. A method for manufacturing a multilayer wiring board, comprising the steps of:
    forming a first conductor layer on a first surface and a second surface of an insulating layer;
    placing a laminated sheet composed of a resin layer and a second conductor layer on the first conductor layer that is formed on the first surface of the insulating layer so that the resin layer comes into contact with that first conductor layer, and curing the resin layer;
    forming a connection hole penetrating the laminated sheet, the first conductor layer formed on the first surface of the insulating layer, and the insulating layer, so that the first conductor layer formed on the second surface of the insulating layer is exposed inside the connection hole;
    forming a third conductor layer on the second conductor layer and inside the connection hole;
    patterning the second conductor layer and the third conductor layer;
    etching the resin layer using the patterned second and third conductor layers as a mask;
    etching the first conductor layer formed on the first surface of the insulating layer using at least the etched resin layer as a mask, and forming a wiring pattern.

2. The method according to claim 1, wherein the resin layer is a layer that is thinner than the first conductor layer.

3. The method according to claim 1, further comprising: removing the second conductor layer.

* * * * *